(12) United States Patent
Dayan et al.

(10) Patent No.: US 10,304,535 B2
(45) Date of Patent: May 28, 2019

(54) ALL-OPTICAL SINGLE-ATOM PHOTON ROUTER CONTROLLED BY A SINGLE PHOTON

(71) Applicant: YEDA RESEARCH AND DEVELOPMENT CO. LTD., Rehovot (IL)

(72) Inventors: Barak Dayan, Tel Aviv (IL); Itay Shomroni, Rehovot (IL); Serge Rosenblum, Rehovot (IL)

(73) Assignee: YEDA RESEARCH AND DEVELOPMENT CO. LTD., Rehovot (IL)

( * ) Notice: Subject to any disclaimer, the term of this patent is extended or adjusted under 35 U.S.C. 154(b) by 0 days.

(21) Appl. No.: 15/562,422

(22) PCT Filed: Mar. 30, 2016

(86) PCT No.: PCT/IL2016/050339
§ 371 (c)(1),
(2) Date: Sep. 28, 2017

(87) PCT Pub. No.: WO2016/157184
PCT Pub. Date: Oct. 6, 2016

(65) Prior Publication Data
US 2018/0053551 A1    Feb. 22, 2018

Related U.S. Application Data

(60) Provisional application No. 62/139,814, filed on Mar. 30, 2015.

(51) Int. Cl.
*G11C 13/04* (2006.01)
*G02F 1/01* (2006.01)
(Continued)

(52) U.S. Cl.
CPC ............... *G11C 13/04* (2013.01); *G02B 6/35* (2013.01); *G02F 1/01* (2013.01); *G02F 1/0126* (2013.01);
(Continued)

(58) Field of Classification Search
CPC .......... G11C 13/04; G11C 7/005; G02B 6/35; G02F 1/01; G02F 1/0126; G02F 1/3521
(Continued)

(56) References Cited

U.S. PATENT DOCUMENTS 5,640,022 A * 6/1997 Inai ..................... B82Y 10/00
257/14
5,917,195 A * 6/1999 Brown ................ H01L 31/0352
257/17
(Continued)

OTHER PUBLICATIONS

Shomroni et al., "All-optical routing of single photons by a one-atom switch controlled by a single photon", Aug. 22, 2014, Science, vol. 345, Issue 6199, p. 903-906. (Year: 2014).*
(Continued)

*Primary Examiner* — Sung H Pak
(74) *Attorney, Agent, or Firm* — Mark S. Cohen; Pearl Cohen Zedek Latzer Baratz LLP

(57) ABSTRACT

A switch activated by a single control photon for routing a single target photon from either of two switch inputs to either of two switch outputs. The device is based on a single quantum emitter, such as an atom, coupled to a fiber-coupled, chip-based optical micro-resonator. A single reflected control photon toggles the switch from high reflection to high transmission mode, with no additional control fields required. The control and target photons are both in-fiber and practically identical, for compatibility with scalable architectures for quantum information processing.

20 Claims, 3 Drawing Sheets

(51) Int. Cl.
G02F 1/35 (2006.01)
G02B 6/35 (2006.01)
G11C 7/00 (2006.01)
B82Y 20/00 (2011.01)
G02B 6/27 (2006.01)

(52) U.S. Cl.
CPC ............ *G02F 1/3521* (2013.01); *G11C 7/005* (2013.01); *B82Y 20/00* (2013.01); *G02B 6/2746* (2013.01); *G02F 2203/15* (2013.01)

(58) Field of Classification Search
USPC ........................................................ 365/106
See application file for complete search history.

(56) References Cited

U.S. PATENT DOCUMENTS

| | | | | |
|---|---|---|---|---|
| 8,975,617 | B2* | 3/2015 | Berco | G06N 99/002 257/24 |
| 2007/0104420 | A1 | 5/2007 | Franson et al. | |
| 2014/0140651 | A1 | 5/2014 | Hafezi et al. | |

OTHER PUBLICATIONS

Alton et al. "Strong interactions of single atoms and photons near a dielectric boundary," Nature Physics 7.2 (2011); 159.
Armani et al. "Ultra-high-Q toroid microcavity on a chip." Nature 421.6926 (2003): 925.
Baur et al. "Single-photon switch based on Rydberg blockade." Physical review letters 112.7 (2014): 073901.
Birnbaum et al. "Photon blockade in an optical cavity with one trapped atom," Nature 436.7047 (2005): 87.
Carmichael, H. J. "Quantum trajectory theory for cascaded open systems." Physical review letters 70.15 (1993): 2273.
Chang et al. "A single-photon transistor using nanoscale surface plasmons." Nature Physics 3.11 (2007): 807.
Chen et al. "All-optical switch and transistor gated by one stored photon." Science (2013): 1237242.
Cirac et al. "Quantum state transfer and entanglement distribution among distant nodes in a quantum network." Physical Review Letters 78.16 (1997): 3221.
Dawes et al. "All-optical switching in rubidium vapor." Science 308.5722 (2005): 672-674.
Dayan et al. "A photon turnstile dynamically regulated by one atom." Science 319.5866 (2008): 1062-1065.
Duan et al. "Scalable photonic quantum computation through cavity-assisted interactions," Physical review letters 92.12 (2004): 127902.
Fleischhauer et al. "Electromagnetically induced transparency: Optics in coherent media." Reviews of modern physics77.2 (2005): 633.
Fushman et al. "Controlled phase shifts with a single quantum dot." Science 320.5877 (2008): 769-772.
Gaetan et al. "Observation of collective excitation of two individual atoms in the Rydberg blockade regime" Nat. Phys. 5, 115 (2009). Nat. Phys. 5 (2009): 115.
Gea-Banacloche et al. "Photon subtraction and addition by a three-level atom in an optical cavity" Physical Review A 88.3 (2013): 033832.
Hofmann et al. "Optimized phase switching using a single-atom nonlinearity" Journal of Optics B: Quantum and Semiclassical Optics 5.3 (2003): 218.
Hoi et al. "Demonstration of a single-photon router in the microwave regime," Physical review letters107.7 (2011): 073601.
Jaksch et al. "Fast quantum gates for neutral atoms" Physical Review Letters 85.10 (2000): 2208.
Junge et al. "Strong coupling between single atoms and nontransversal photons" Physical review letters 110.21 (2013): 213604.
Kimble, H. Jeff "The quantum internet" Nature 453.7198 (2008): 1023.
Koshino et al. "Deterministic photon-photon SWAP gate using a Λ system" Physical Review a 82.1 (2010): 010301.
Peyronel et al. "Quantum nonlinear optics with single photons enabled by strongly interacting atoms" Nature 488.7409 (2012): 57.
Pinotsi et al. "Single photon absorption by a single quantum emitter" Physical review letters 100.9 (2008): 093603.
Press et al. "Photon antibunching from a single quantum-dot-microcavity system in the strong coupling regime." Physical Review Letters 98.11 (2007): 117402.
Reiserer et al. "Nondestructive detection of an optical photon" Science(2013): 1246164.
Reiserer et al. "A quantum gate between a flying optical photon and a single trapped atom" Nature508.7495 (2014): 237.
Righini et al. "Whispering gallery mode microresonators: fundamentals and applications" Rivista del Nuovo Cimento 34.7 (2011): 435-488.
Rosenblum et al. "Photon routing in cavity QED: Beyond the fundamental limit of photon blockade" Physical Review A 84.3 (2011): 033854.
Shomroni et al. "All-optical routing of single photons by a one-atom switch controlled by a single photon" Science 345.6199 (2014): 903-906; and supplementary material.
Thompson et al. "Observation of normal-mode splitting for an atom in an optical cavity" Physical Review Letters 68.8 (1992): 1132.
Tiecke et al. "Nanophotonic quantum phase switch with a single atom" Nature 508.7495 (2014): 241.
Turchette et al. "Measurement of conditional phase shifts for quantum logic" Physical Review Letters 75.25 (1995): 4710.
Volz et al. "Nonlinear π phase shift for single fibre-guided photons interacting with a single resonator-enhanced atom" Nature Photonics 8.12 (2014): 965.
Witthaut et al. "Photon scattering by a three-level emitter in a one-dimensional waveguide" New Journal of Physics 12.4 (2010): 043052.

\* cited by examiner

ALL-OPTICAL SINGLE-ATOM PHOTON ROUTER CONTROLLED BY A SINGLE PHOTON

CROSS-REFERENCE TO RELATED APPLICATIONS

This application is a National Phase Application of PCT International Application No. PCT/IL2016/050339, International Filing Date Mar. 30, 2016, claiming priority of US Provisional Patent Application No. 62/139,814, filed Mar. 30, 2015, which are hereby incorporated by reference.

BACKGROUND

Photons are considered ideal for communication of quantum information because they are the most convenient carriers of quantum bits (qubits), yet the lack of photon-photon interactions limits their use for quantum information processing. Achieving nonlinear behavior at the level of single photons—that is, photon-photon interactions and quantum gates controlled by single photons in particular—is a major challenge in realizing quantum networks in which quantum information would be processed by material quantum nodes interconnected by photonic channels.

Because photons do not interact directly with other photons, considerable effort has been put into implementing materially-mediated photon-photon interactions. A significant advancement was the attainment of strong coupling between single atoms and optical micro-resonators in the field of cavity quantum electrodynamics, where the tight confinement of light in tiny volumes leads to extreme enhancement of the electric field associated with photons in the cavity mode.

Most notably, based on a scheme involving auxiliary control fields, recent works have demonstrated: nondestructive measurement of an optical photon; a single-photon phase switch; and a quantum gate between flying photons and a single atom, showing atom-photon, photon-photon, and atom-photon-photon quantum entanglement. All of these effects can be directly applied to photonic routing.

Yet the need in auxiliary control fields (e.g. Raman laser beams or microwave fields, or other classical control fields) seriously limits both the scalability and the speed of such schemes, as each operation of each individual atom or other material node requires a series of a few microseconds-long (typically) control pulses and/or measurements.

In order to enable scalable quantum networks there is a need for a passive device that coherently routes and manipulates photons between multiple ports, enabling conversion of the photons from one wavelength to another, and which is activated solely by single photons, making it compatible with large-scale photonic circuits. This goal is achieved by embodiments of the present invention.

SUMMARY

Embodiments of the present invention provide a robust, simple and scalable device for all-optical coherent routing of single photons by single photons, with no need for any additional control fields. A device according to an embodiment of the invention utilizes a single three-level quantum emitter (non-limiting examples of which include: an atom, a Rubidium atom, a $^{87}$Rb atom, a $^{85}$Rb atom; and a quantum dot) proximate to, and associated with, a resonant cavity such as a micro-resonator cavity, and features mediation of the cavity-enhanced three-level quantum emitter to route a single photon from one input port, or from a coherent superposition of the input ports, to an output port or to a coherent superposition of the output ports.

The crucial parameter in such a system is the Purcell enhancement factor, or the equivalent Cooperativity parameter $C=g^2/\kappa\gamma$ (with $\kappa=\kappa_i+\kappa_{ex}$), where g is the coherent coupling rate between the quantum emitter and the cavity mode, is the incoherent loss of the cavity, $\kappa_{ex}$ is the coupling between the cavity and its input/output modes and $2\gamma$ is the spontaneous emission rate of the quantum emitter. C is the ratio between the quantum emitter's cavity-enhanced spontaneous emission rate $g^2/\kappa$ into the output mode, to the free-space emission rate $\gamma$, and is proportional to the ratio between the cavity's quality factor Q to its mode volume V. Accordingly, by coupling the quantum emitter to high-quality (small $\kappa_i$) optical micro-resonators with tiny mode volumes, it is therefore possible to reach C>>1 including both the "fast-cavity regime" and the "strong coupling regime".

The underlying mechanism in embodiments of the invention is simple and robust, and is similar to the interference mechanism that makes metallic mirrors reflect light. The free charges in the mirror oscillate in response to the incoming field and radiate both forward and backward fields that are opposite in phase to the incoming field. The result is destructive interference in the forward direction, which forces the incoming light to be reflected backwards. The same effect occurs with a probe photon incident on a two-level quantum emitter in one-dimensional geometry: the system radiates both forward and backwards with a phase shift of π (radians), and the destructive interference with the incoming probe in the forward direction leads to reflection of the probe backwards.

Various embodiments of the invention rely on a special 3-level Λ system coupled to a waveguide, which exhibits the same effect. Specifically, each 'leg' of the Λ system is coupled only to one mode, e.g. one transition is coupled to the forward direction of the waveguide, and the other to the backward direction. In this configuration the same destructive interference effect occurs, meaning that a photon coming in one mode (or a coherent combination of input modes) would be routed to an output mode (or a coherent combination of input modes) that is determined by the initial state of the Λ system. This process is accompanied by projecting the Λ system to the state dictated by the incoming photon.

Embodiments of the present invention provide compatibility with scalable photonic architectures. A device according to various embodiments requires only single-photon pulses for operation, all of which are identical, and routed to the selected output ports over waveguides. In a related embodiment, the waveguide is a single-mode waveguide. In another related and non-limiting embodiment, a tapered nanofiber is used as a waveguide. Thus, a routed target photon can serve as the control photon in another device, and that same control photon can activate a number of devices. Embodiments of the present invention therefore provide versatile, robust and simple building-blocks for a variety of all-optical photonic devices, including, but not limited to: quantum memory, single photon add/drop filters, and photonic quantum gates, all of which require no additional power, and which are compatible with scalable quantum networks.

Therefore, according to an embodiment of the present invention there is provided a device for storing and reading a circular polarization of a photon and for routing single photons by single photons, the device including: (a) a waveguide supporting a first electromagnetic mode and a second electromagnetic mode, wherein the first electromagnetic mode is distinct from the second electromagnetic mode, the waveguide having: (b) a first input port for a photon; (c) a second input port for a photon; (d) a first output port for a photon; and (e) a second output port for a photon; (f) wherein the first input port is distinct from the second input port and the first output port is distinct from the second output port; (g) a quantum emitter having: (h) a first ground state; (i) a second ground state; (j) an excited state; (k) a first transition, between the first ground state and the excited state, the first transition having a first circular polarization; and (l) a second transition, between the second ground state and the excited state, the second transition having a second circular polarization; (m) wherein: (n) the first ground state is distinct from the second ground state; (o) the first circular polarization is opposite of the second circular polarization; (p) the first electromagnetic mode couples to the first transition; and the second electromagnetic mode couples to the second transition.

BRIEF DESCRIPTION OF THE DRAWINGS

The subject matter disclosed may best be understood by reference to the following detailed description when read with the accompanying drawings in which.

Figure 1A:
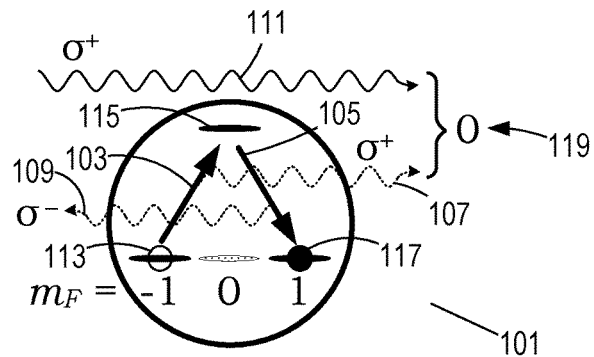
FIG. 1A is an energy-level diagram of transitions in a quantum emitter which reflects a right-propagating photon.

For simplicity and clarity of illustration, elements shown in the figures are not necessarily drawn to scale, and the dimensions of some elements may be exaggerated relative to other elements. In addition, reference numerals may be repeated among the figures to indicate corresponding or analogous elements.

DETAILED DESCRIPTION

Embodiments of the invention use the above-described mechanism for optical switching, by introducing 'memory' into the system, that is, making the reflection of a single control photon toggle the internal state of the quantum emitter.

Various embodiments of the present invention utilize bi-directional photon paths. For simplicity, the descriptions and illustrations herein arbitrarily refer to the first direction of photon propagation as "right" (or equivalently "left-to-right") and the second direction of photon propagation as "left" (or equivalently "right-to-left"). It is understood, however, that this is non-limiting, and that other distinguishing representations can equivalently be used (e.g., "up" and "down", "forward" and "backward", etc.) to describe the same embodiments.

In an embodiment of the present invention, a photon is considered to be circularly polarized if the probability of detecting the photon in a particular state of circular polarization is greater than $2/3$. In a related embodiment of the invention, the two distinct circular polarization states correspond to two distinct electromagnetic modes of a waveguide. In another related embodiment, the waveguide is an optical waveguide. In a further related embodiment, the waveguide is a microwave waveguide.

In certain embodiments of the invention, the waveguide couples directly to the quantum emitter. In other embodiments, the waveguide couples to the quantum emitter indirectly via a resonant cavity. In a related embodiment, a circular polarization of a photon corresponds to a Transverse Magnetic (TM) mode of a waveguide.

In various embodiments of the invention, the two distinct quantum emitter transitions from the two distinct ground states to the excited state correspond respectively to the two different circular polarizations.

According to an embodiment of the invention, an initial ground state of the quantum emitter is at $m_F=-1$ with an incoming $\sigma^+$ probe photon. Destructive interference between the probe and the $\sigma^+$ photon emitted by the quantum emitter forces the quantum emitter to emit a $\sigma^-$ photon in the opposite direction, thereby deterministically ending at a final ground state at $m_F=+1$. As a result, any subsequent $\sigma^+$ photons will not interact with the quantum emitter and will accordingly be transmitted. Symmetrically, at this stage the system becomes reflective to $\sigma^-$ photons coming right-to-left from the right.

FIG. 1A conceptually illustrates the above embodiment, implemented by a Λ configuration for a three-level quantum emitter 101 which has a transition 103 from a first ground state 113 ($m_F=-1$) to an excited state 115; and a transition 105 from excited state 115 to a second ground state 117 ($m_F=+1$). Transition 103 is coupled only to an input photon having a left-to-right direction of propagation, shown for a $\sigma^+$ input photon 111. Transition 105 is coupled only to an output photon having a right-to-left direction of propagation, shown for a $\sigma^-$ output photon 109. As discussed previously, left-to-right propagating output photon 107 is 180 degrees out of phase with input photon 111, and through destructive interference, the net transmission 119 is zero.

Figure 1B:
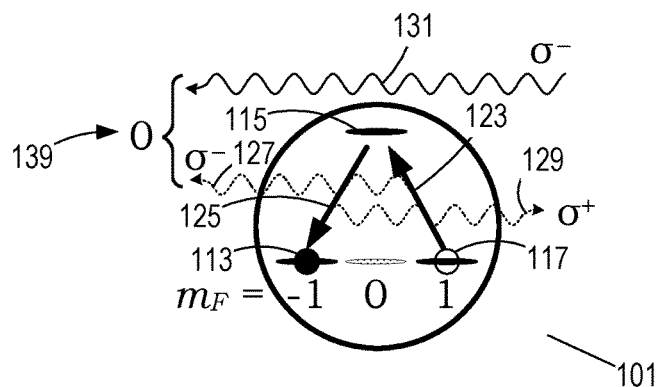
FIG. 1B is an energy-level diagram of transitions in quantum emitter which reflects a left-propagating photon.

FIG. 1B conceptually illustrates the symmetrical complement of the arrangement in FIG. 1A, in which three-level quantum emitter 101 has a transition 123 from second ground state 117 ($m_F=+1$) to excited state 115; and a transition 125 from excited state 115 to first ground state 113 ($m_F=-1$). Transition 123 is coupled only to an input photon having a right-to-left direction of propagation, shown for a $\sigma^-$ input photon 131. Transition 125 is coupled only to an output photon having a left-to-right direction of propagation, shown for a $\sigma^+$ output photon 129. As discussed previously, right-to-left propagating output photon 127 is 180 degrees out of phase with input photon 131, and through destructive interference, the net transmission 139 is zero.

Figure 1C:
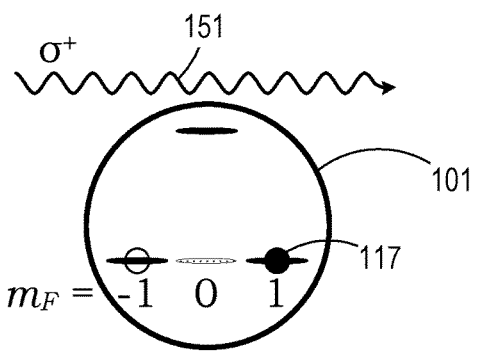
FIG. 1C is an energy-level diagram of a quantum emitter which transmits a right-propagating photon with no transitions.

FIG. 1C conceptually illustrates the above embodiment in the case when three-level quantum emitter 101 is in second ground state 117 for a right-propagating $\sigma^+$ input photon 151. No transition occurs in this case: three-level atom 101 remains in second ground state 117 and $\sigma^+$ photon 151 is transmitted without reflection.

Figure 1D:
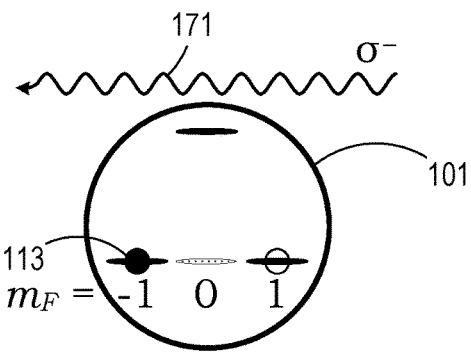
FIG. 1D is an energy-level diagram of quantum emitter which transmits a left-propagating photon with no transitions.

FIG. 1D conceptually illustrates the above embodiment in the case when three-level quantum emitter 101 is in first ground state 113 for a left-propagating σ⁻ input photon 171. No transition occurs in this case: three-level atom 101 remains in first ground state 114 and σ⁻ photon 171 is transmitted without reflection.

For certain embodiments of the present invention, an input photon may serve the purpose of setting or discovering the state of the quantum emitter. In a non-limiting example, the input photon may be intended to put the quantum emitter into a selected state (to reflect or transmit a photon); in this case, such an input photon may be denoted as a "control" photon, and a subsequent input photon which is to be routed by the quantum emitter (i.e., switched to a selective path via reflection or transmission by the quantum emitter) may be denoted as a "target" photon. In another non-limiting example, the input photon may be intended to discover the quantum emitter's state; in this case, such an input photon may be denoted as a "probe" photon. Structurally, however, there is no qualitative difference between a control photon, a target photon, and a probe photon. These terms are used in the context of particular embodiments simply according to the intended purpose of the photon.

Figure 2:
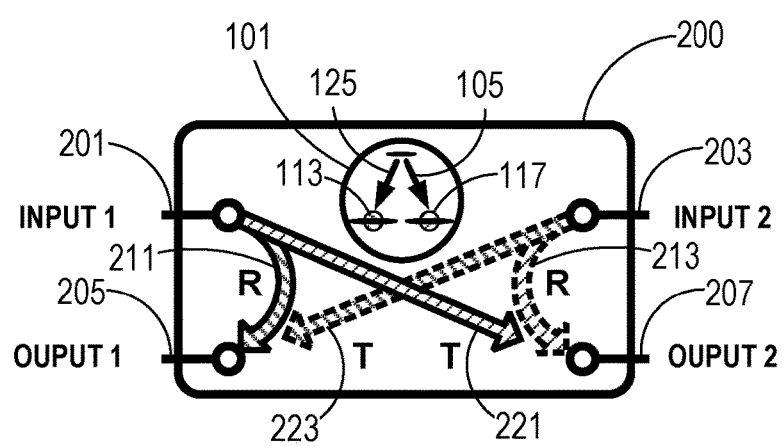
FIG. 2 is a schematic diagram of a photon routing device according to an embodiment of the present invention.

FIG. 2 schematically illustrates an embodiment of the present invention, which provides a symmetric toggle-switch 200 with two inputs (an input 201 and an input 203), two outputs (an output 205 and an output 207), and two internal states (state 113 and state 117), where a transition of atom 101 (transition 105 or transition 125) toggles the state of switch 200 (accompanied by a reflection of an input control photon) for routing one or more subsequent target photons. A first input 201 and a second input 203 accept photons for control of the switch and/or routing of photons by switch 200. Photon routing is according to the state of switch 200, in keeping with the transition rules shown in FIG. 1A through FIG. 1D:

when three-level quantum emitter 101 is in state 113, a photon input into input port 1 201 undergoes a reflection 211 to output port 1 205;

when three-level quantum emitter 101 is in state 117, a photon input into input port 1 201 continues with a transmission 221 to output port 2 207;

when three-level quantum emitter 101 is in state 117, a photon input into input port 2 203 undergoes a reflection 213 to output port 2 207; and when three-level quantum emitter 101 is in state 113, a photon input into input port 2 203 continues with a transmission 223 to output port 1 205.

In a related embodiment, a conventional time-bin protocol is used to define a first input photon as the control photon, and a second input photon as the target, to be routed from a selected input to a selected output.

Figure 3A:
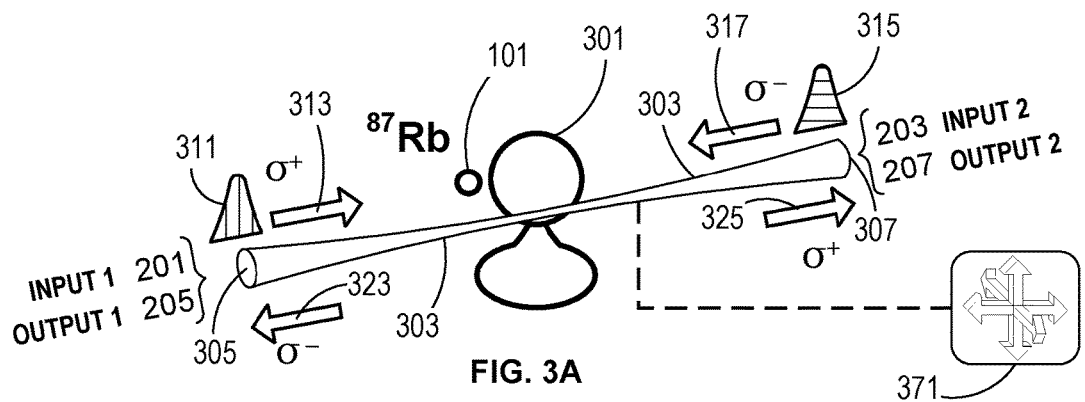
FIG. 3A illustrates a physical configuration of a photon routing device according to an embodiment of the present invention.

FIG. 3A illustrates a physical configuration of an embodiment of the present invention, in which three-level quantum emitter 101 is a single Rubidium atom. In a related embodiment, the Rubidium atom is the isotope $^{87}$Rb. In another related embodiment, three-level atom 101 is coupled to a chip-based whispering-gallery mode (WGM) silica microsphere resonator 301. Light is evanescently coupled to and from resonator 301 by a tapered nanofiber 303. The coupling $\kappa_{ex}$ between resonator 301 and nanofiber is 303 set by careful alignment of their relative position using a piezo positioning system 371. In other embodiments of the present invention, micro-resonator 301 is a microdisk resonator; in additional embodiments, micro-resonator 301 is a micro-toroid resonator; in still further embodiments, micro-resonator 301 is a ring resonator.

In various embodiments of the invention, a transverse-magnetic (TM) mode of the micro-resonator is used, which approximates to a high degree the coupling of σ⁺ and σ⁻ polarizations to opposite directions of propagation. It is known that the polarization in the evanescent wave region is very close to σ⁺ in one direction, and σ⁻ in the other, with minimal cross-contamination. In these embodiments the polarizations of the respective σ⁺ and σ⁻ input photons are the polarizations that maximally couple to the CW and CCW modes of the cavity resonance. Thus, there is a one-to-one correspondence between the direction in which the photon propagates in the fiber, and the transition in the atom. A σ⁺ photon input in a pulse 311 propagating in a left-to-right direction 313 from a face 305 of nanofiber 303 triggers a transition from the $m_F=-1$ state to the $m_F=+1$ state (and the input photon is reflected), whereas a σ⁻ input photon in a pulse 315 propagating in a right-to-left direction 317 from a face 307 of nanofiber 303 triggers a transition from the $m_F=+1$ state to the $m_F=-1$ state (and the input photon in pulse 315 is reflected in a left-to-right direction 325).

A photon automatically has the proper polarization to initiate the transition if it is sent from the proper input port and is resonantly coupled to the cavity. As described and illustrated herein, if the atom is already in the $m_F=+1$ state, left-to-right σ⁺ input photon in pulse 311 triggers no transition (and input photon in pulse 311 is transmitted in a direction 325 without reflection); if the atom is already in the $m_F=-1$ state, right-to-left σ⁻ input photon in pulse 315 triggers no transition (and the input photon in pulse 315 is transmitted in a direction 323 without reflection).

According to an embodiment of the present invention, resonator 301 and the probe photon are tuned to be resonant with the F=1→F=0 transition of the $^{87}$Rb D$_2$ line. As atoms in the state $m_F=0$ barely interact with the TM mode, by choosing this manifold the desired Λ-configuration is attained, as illustrated in FIG. 1A and FIG. 1B, although, for this specific non-limiting case, at the price of decreasing the coherent coupling rate g by a factor of the square root of 3 compared to the cycling transition (F=2→F=3), in which mean g=27 MHz is measured. To reach the fast cavity limit $\kappa_{ex}$ is set to 30 MHz, corresponding to mean $g^2/\kappa\gamma=2.2$.

Figure 3B:
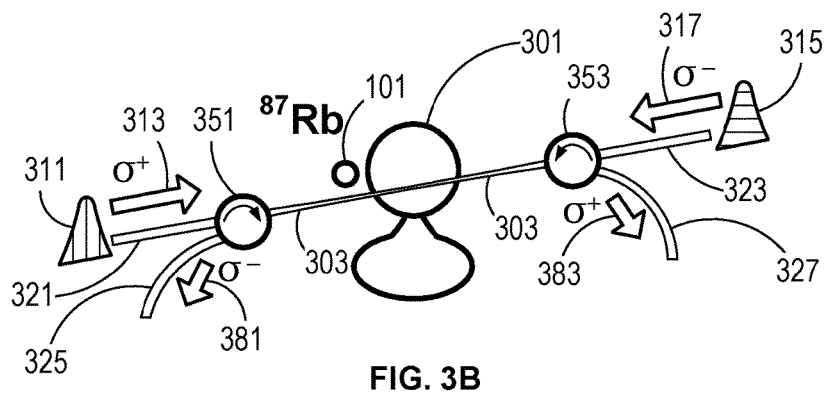
FIG. 3B illustrates a physical configuration of a photon routing device according to another embodiment of the present invention.

FIG. 3B illustrates a physical configuration of another embodiment of the present invention, in which input ports are separated and isolated from output ports, meaning that only input photons propagate in input fibers, and only output photons propagate in output fibers. A first input fiber 321 is coupled to tapered nanofiber 303 by an optical circulator 351. In addition, a first output fiber 325 is also coupled to tapered nanofiber 303 by optical circulator 351. Likewise, a second input fiber 323 is coupled to tapered nanofiber 303 by an optical circulator 353, and a second output fiber 327 is also coupled to tapered nanofiber 303 by optical circulator 353.

Although photon propagation in tapered nanofiber 303 is bidirectional, optical circulator 351 enables uni-directional photon propagation in input fiber 321 (in which σ⁺ photons propagate in direction 313) and in output fiber 325 (in which σ⁻ photons propagate in a direction 381). Likewise, optical circulator 353 enables uni-directional photon propagation in input fiber 323 (in which σ⁻ photons propagate in direction 317) and in output fiber 327 (in which σ⁺ photons propagate in a direction 383).

Figure 3C:
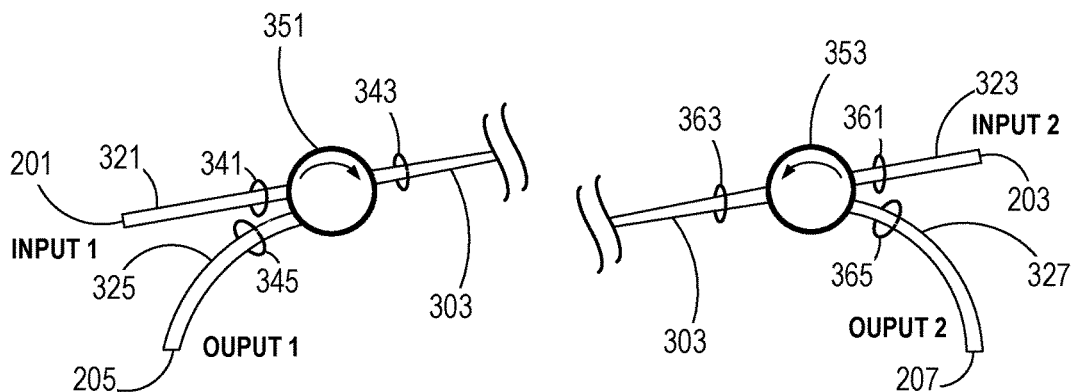
FIG. 3C illustrates details of the port arrangement for the configuration shown in FIG. 3B.

FIG. 3C illustrates details of the configuration of FIG. 3B, to show how optical circulator 351 and optical circulator 353 separate and isolate inputs from outputs. In this embodiment, first input port 201 is the face of optical fiber 321, and first output port 205 is the face of optical fiber 325. Photons (σ⁺) in input fiber 321 propagating into optical circulator 351 via a circulator port 341 are routed from a circulator port 343 into tapered nanofiber 303. However, photons ($\sigma^-$) propagating from nanofiber 303 into optical circulator 351 via circulator port 343 are routed by a circulator port 345 into output fiber 325. Likewise, second input port 203 is the face of optical fiber 323, and second output port 207 is the face of optical fiber 327. Photons ($\sigma^-$) in input fiber 323 propagating into optical circulator 353 via a circulator port 361 are routed from a circulator port 363 into tapered nanofiber 303. However, photons ($\sigma^+$) propagating from nanofiber 303 into optical circulator 353 via circulator port 363 are routed by a circulator port 365 into output fiber 327.

NON-LIMITING EXAMPLE OF DETECTING PRESENCE AND STATE OF A QUANTUM EMITTER

The presence of a single atom within the evanescent wave of the TM mode can be identified by sending weak (averaging about 2.5 photons per pulse) and short (approximately 15 ns FWHM) pulses in the nanofiber in alternating directions and detecting at least three reflected photons within less than 400 ns. Interleaved between the detection pulses are much weaker pulses (an average of 0.24 photons in each pulse) and longer (approximately 50 ns FWHM) target pulses, whose purpose is to accurately measure single-photon reflection and transmission properties of the switch-router. The last detection pulse before each target pulse serves as the control to set the atom in a predetermined initial state. The pulse sequence includes control pulses in both directions, thereby preparing the atom half of the time in $m_F=-1$, and half of the time in $m_F=+1$, with the target pulse always polarized $\sigma^+$.

OTHER USES

Besides serving as a switch or router for photons, an embodiment of the present invention can also serve as device for storing a classical bit of information, encoded in the state of the quantum emitter. In another embodiment, a qubit (quantum bit) of information can be stored, wherein the qubit is in a superposition of two distinct states.

What is claimed is:

1. A device for storing and reading a circular polarization of a photon and for routing a single target photon by a single control photon, the device comprising:
   a waveguide supporting a first electromagnetic mode and a second electromagnetic mode, wherein the first electromagnetic mode is distinct from the second electromagnetic mode, the waveguide coupled to:
      a first input port for a photon;
      a second input port for a photon;
      a first output port for a photon; and
      a second output port for a photon;
      wherein the first input port is distinct from the second input port and the first output port is distinct from the second output port:
   a quantum emitter having:
      a first ground state;
      a second ground state;
      an excited state;
      a first transition, between the first ground state and the excited state, the first transition having a first circular polarization; and
      a second transition, between the second ground state and the excited state, the second transition having a second circular polarization;
   wherein:
      the first ground state is distinct from the second ground state;
      the first circular polarization is opposite of the second circular polarization;
      the first electromagnetic mode couples to the first transition; and the second electromagnetic mode couples to the second transition.

2. The device of claim 1, wherein the waveguide couples to the quantum emitter via a resonant cavity.

3. The device of claim 2, wherein the resonant cavity is a micro-resonator.

4. The device of claim 1, wherein the waveguide is an optical waveguide.

5. The device of claim 1, wherein the waveguide is a microwave waveguide.

6. The device of claim 1, wherein the quantum emitter is a Rubidium atom.

7. The device of claim 6, wherein the Rubidium atom is a $^{87}$Rb atom.

8. The device of claim 1, wherein the micro-resonator is in a transverse magnetic (TM) mode.

9. The device of claim 2, wherein the micro-resonator is a microsphere.

10. The device of claim 9, wherein the microsphere is a silica microsphere.

11. The device of claim 3, wherein the micro-resonator is a micro-toroid.

12. The device of claim 11, wherein the micro-toroid is a silica micro-toroid.

13. The device of claim 3, wherein the micro-resonator is a microdisk.

14. The device of claim 3, wherein the micro-resonator is a ring resonator.

15. The device of claim 4, wherein the optical waveguide comprises a tapered nanofiber and the waveguide is coupled to the quantum emitter via a micro-resonator.

16. The device of claim 15, further comprising a piezo positioning device, for aligning the tapered nanofiber with the micro-resonator.

17. The device of claim 15, wherein an input port is coupled to the tapered nanofiber by an optical circulator.

18. The device of claim 17, wherein the optical circulator is further coupled to an output port.

19. The device of claim 18, wherein the input port is isolated from the output port by the optical circulator.

20. The device of claim 1, wherein the quantum emitter is selected from a group consisting of: an atom, a nitrogen vacancy center, a superconducting quibit, and a quantum dot.

* * * * *